United States Patent
Mark et al.

(10) Patent No.: US 11,294,765 B1
(45) Date of Patent: *Apr. 5, 2022

(54) RESOLVING WRITE CONFLICTS IN A DISPERSED STORAGE NETWORK

(71) Applicant: Pure Storage, Inc., Mountain View, CA (US)

(72) Inventors: Zachary J. Mark, Chicago, IL (US); Ilya Volvovski, Chicago, IL (US); Greg R. Dhuse, Chicago, IL (US)

(73) Assignee: PURE STORAGE, INC., Mountain View, CA (US)

( * ) Notice: Subject to any disclaimer, the term of this patent is extended or adjusted under 35 U.S.C. 154(b) by 49 days.

This patent is subject to a terminal disclaimer.

(21) Appl. No.: 16/860,883

(22) Filed: Apr. 28, 2020

Related U.S. Application Data (63) Continuation of application No. 16/145,305, filed on Sep. 28, 2018, now Pat. No. 10,678,638, which is a
(Continued)

(51) Int. Cl.
*G11C 29/00* (2006.01)
*G06F 11/10* (2006.01)
(Continued)

(52) U.S. Cl.
CPC .......... *G06F 11/1076* (2013.01); *G06F 3/064* (2013.01); *G06F 3/067* (2013.01);
(Continued)

(58) Field of Classification Search
CPC ......... G06F 17/30324; G06F 17/30864; G06F 17/30917; G06F 11/1092; G06F 2211/1028
See application file for complete search history.

(56) References Cited

U.S. PATENT DOCUMENTS

| 4,092,732 A | 5/1978 | Ouchi |
| 5,454,101 A | 9/1995 | Mackay et al. |
| (Continued) | | |

OTHER PUBLICATIONS

Chung; An Automatic Data Segmentation Method for 3D Measured Data Points; National Taiwan University; pp. 1-8; 1998.
(Continued)

*Primary Examiner* — Samir W Rizk
(74) *Attorney, Agent, or Firm* — Garlick & Markison; Timothy W. Markison; Bruce E. Stuckman (57) ABSTRACT

A method for execution by a dispersed storage and task (DST) execution unit includes receiving a write slice request from a requesting entity, where the write slice request includes a plurality of encoded data slices and a corresponding plurality of slice names. The plurality of slice names are interpreted to produce a slice name range. Whether a write lock conflict exists is determined based on the slice name range. An unfavorable write slice response is issued to the requesting entity when the write lock conflict is determined to exist. When the write lock conflict is determined to not exist, local storage of the plurality of encoded data slices is initiated, a favorable write slice response is issued to the requesting entity, and the processing system indicates that the slice name range is not locked when completing the local storage of the plurality of encoded data slices.

20 Claims, 7 Drawing Sheets

Related U.S. Application Data continuation-in-part of application No. 15/679,569, filed on Aug. 17, 2017, now Pat. No. 10,169,150, which is a continuation of application No. 15/351,628, filed on Nov. 15, 2016, now Pat. No. 9,798,619, which is a continuation of application No. 14/589,391, filed on Jan. 5, 2015, now Pat. No. 9,529,834.

(60) Provisional application No. 61/944,742, filed on Feb. 26, 2014.

(51) Int. Cl.
| | |
|---|---|
| *H03M 13/29* | (2006.01) |
| *G06F 3/06* | (2006.01) |
| *G06F 16/951* | (2019.01) |
| *G06F 16/22* | (2019.01) |
| *G06F 16/27* | (2019.01) |
| *G06F 16/23* | (2019.01) |
| *H03M 13/37* | (2006.01) |
| *G06F 16/84* | (2019.01) |
| *H03M 13/15* | (2006.01) |

(52) U.S. Cl.
CPC ........ *G06F 3/0619* (2013.01); *G06F 11/1092* (2013.01); *G06F 16/2237* (2019.01); *G06F 16/2336* (2019.01); *G06F 16/278* (2019.01); *G06F 16/86* (2019.01); *G06F 16/951* (2019.01); *H03M 13/2906* (2013.01); *H03M 13/3761* (2013.01); *G06F 2211/1028* (2013.01); *H03M 13/1515* (2013.01)

(56) References Cited

U.S. PATENT DOCUMENTS

| | | | |
|---|---|---|---|
| 5,485,474 | A | 1/1996 | Rabin |
| 5,774,643 | A | 6/1998 | Lubbers et al. |
| 5,802,364 | A | 9/1998 | Senator et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de la Torre et al. |
| 9,542,239 | B2 | 1/2017 | Gray et al. |
| 10,678,638 | B2 * | 6/2020 | Mark ................... G06F 16/278 |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0037261 | A1 | 2/2003 | Meffert et al. |
| 2003/0065617 | A1 | 4/2003 | Watkins et al. |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula |
| 2005/0132070 | A1 | 6/2005 | Redlich et al. |
| 2005/0144382 | A1 | 6/2005 | Schmisseur |
| 2005/0229069 | A1 | 10/2005 | Hassner et al. |
| 2006/0047907 | A1 | 3/2006 | Shiga et al. |
| 2006/0136448 | A1 | 6/2006 | Cialini et al. |
| 2006/0156059 | A1 | 7/2006 | Kitamura |
| 2006/0224603 | A1 | 10/2006 | Correll |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0283167 | A1 | 12/2007 | Venters et al. |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

Legg; Lightweight Directory Access Protocol (LDAP): Syntaxes and Matching Rules; IETF Network Working Group RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

Satran, et al.; Internet Small Computer Systems Interface (iSCSI); IETF Network Working Group; RFC 3720; Apr. 2004; pp. 1-257.

Sciberras; Lightweight Directory Access Protocol (LDAP): Schema for User Applications; IETF Network Working Group; RFC 4519; Jun. 2006; pp. 1-33.

Sermersheim; Lightweight Directory Access Protocol (LDAP): The Protocol; IETF Network Working Group; RFC 4511; Jun. 2006; pp. 1-68.

Shamir; How to Share a Secret; Communications of the ACM; vol. 22, No. 11; Nov. 1979; pp. 612-613.

Smith; Lightweight Directory Access Protocol (LDAP): String Representation of Search Filters; IETF Network Working Group; RFC 4515; Jun. 2006; pp. 1-12.

Smith; Lightweight Directory Access Protocol (LDAP): Uniform Resource Locator; IETF Network Working Group; RFC 4516; Jun. 2006; pp. 1-15.

(56) References Cited

OTHER PUBLICATIONS

Wildi; Java iSCSi Initiator; Master Thesis; Department of Computer and Information Science, University of Konstanz; Feb. 2007; 60 pgs.

Xin, et al.; Evaluation of Distributed Recovery in Large-Scale Storage Systems; 13th IEEE International Symposium on High Performance Distributed Computing; Jun. 2004; pp. 172-181.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): Directory Information Models; IETF Network Working Group; RFC 4512; Jun. 2006; pp. 1-49.

Zeilenga; Lightweight Directory Access Protocol (LDAP): Internationalized String Preparation; IETF Network Working Group; RFC 4518; Jun. 2006; pp. 1-14.

Zeilenga; Lightweight Directory Access Protocol (LDAP): String Representation of Distinguished Names; IETF Network Working Group; RFC 4514; Jun. 2006; pp. 1-15.

\* cited by examiner

RESOLVING WRITE CONFLICTS IN A DISPERSED STORAGE NETWORK

CROSS-REFERENCE TO RELATED APPLICATIONS

The present U.S. Utility Patent Applications claims priority pursuant to 35 U.S.C. § 120 as a continuation of U.S. Utility application Ser. No. 16/145,305, entitled "RESOLVING WRITE CONFLICTS IN A DISPERSED STORAGE NETWORK", filed Sep. 28, 2018, which is a continuation-in-part of U.S. Utility application Ser. No. 15/679,569, entitled "CONCATENATING DATA OBJECTS FOR STORAGE IN A DISPERSED STORAGE NETWORK", filed Aug. 17, 2017, issued as U.S. Pat. No. 10,169,150 on Jan. 1, 2019, which is a continuation of U.S. Utility application Ser. No. 15/351,628, entitled "CONCATENATING DATA OBJECTS FOR STORAGE IN A DISPERSED STORAGE NETWORK", filed Nov. 15, 2016, issued as U.S. Pat. No. 9,798,619 on Oct. 24, 2017, which is a continuation of U.S. Utility application Ser. No. 14/589,391, entitled "CONCATENATING DATA OBJECTS FOR STORAGE IN A DISPERSED STORAGE NETWORK", filed Jan. 5, 2015, issued as U.S. Pat. No. 9,529,834 on Dec. 27, 2016, which claims priority pursuant to 35 U.S.C. § 119(e) to U.S. Provisional Application No. 61/944,742, entitled "EXECUTING TASKS IN A DISTRIBUTED STORAGE AND TASK NETWORK", filed Feb. 26, 2014, all of which are hereby incorporated herein by reference in their entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

DETAILED DESCRIPTION OF THE INVENTION

Figure 1:
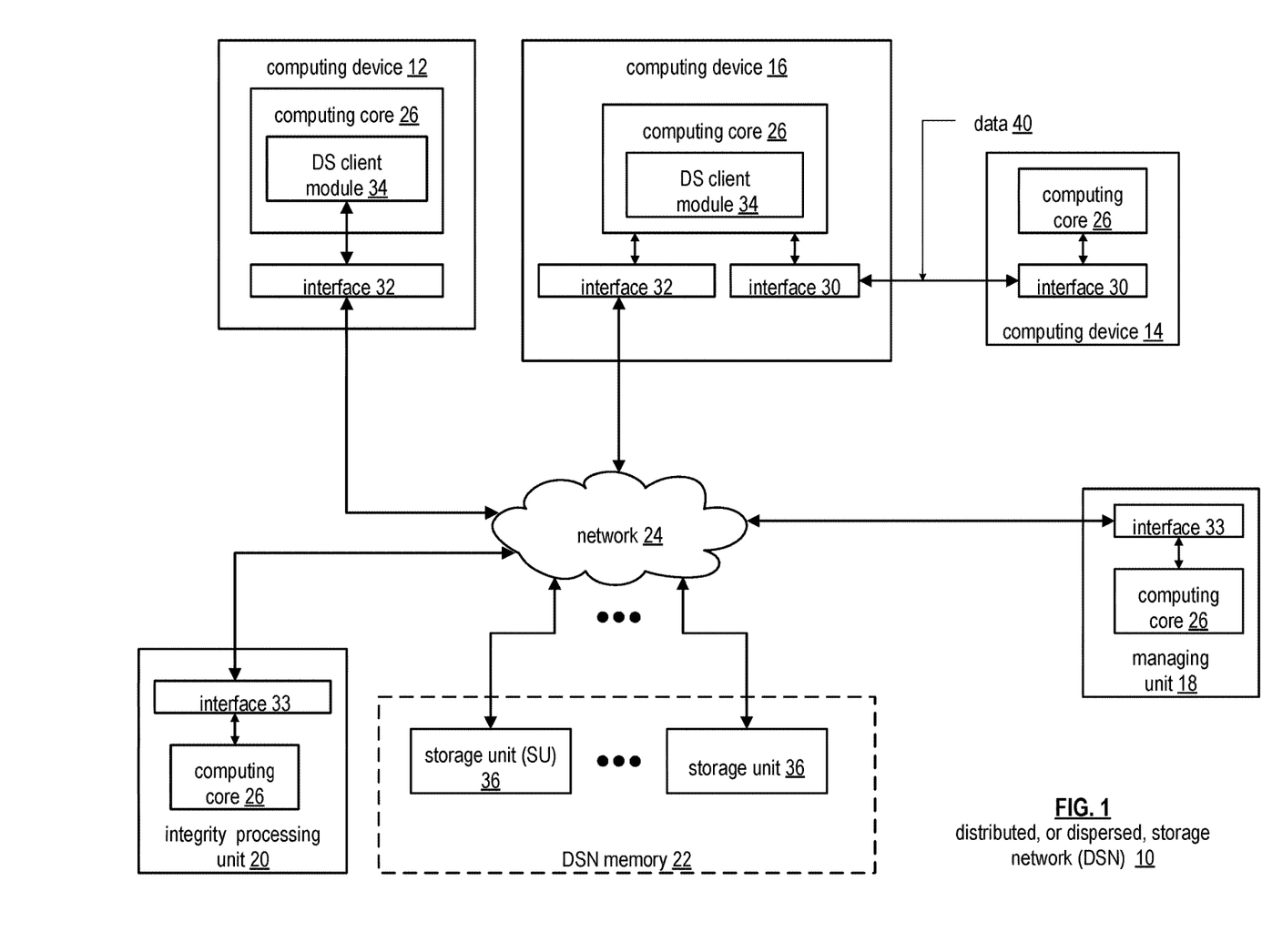
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
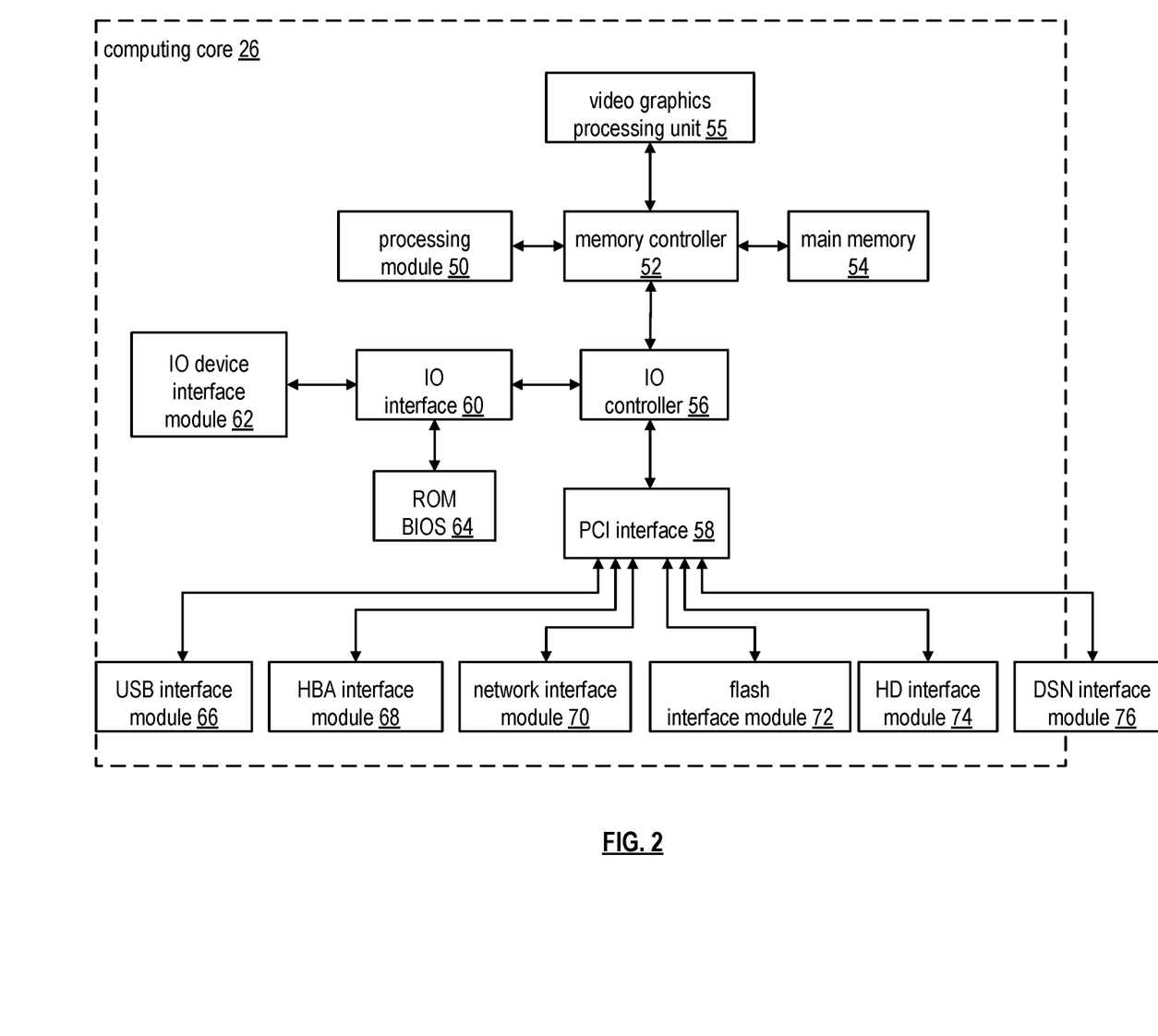
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

In various embodiments, each of the storage units operates as a distributed storage and task (DST) execution unit, and is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc. Hereafter, a storage unit may be interchangeably referred to as a dispersed storage and task (DST) execution unit and a set of storage units may be interchangeably referred to as a set of DST execution units.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each managing unit 18 and the integrity processing unit 20 may be separate computing devices, may be a common computing device, and/or may be integrated into one or more of the computing devices 12-16 and/or into one or more of the storage units 36. In various embodiments, computing devices 12-16 can include user devices and/or can be utilized by a requesting entity generating access requests, which can include requests to read or write data to storage units in the DSN.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSN managing unit 18 tracks the number of times a user accesses a non-public vault and/or public vaults, which can be used to generate a per-access billing information. In another instance, the DSN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an 10 interface module 60, at least one 10 device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

Figures 3, 4:
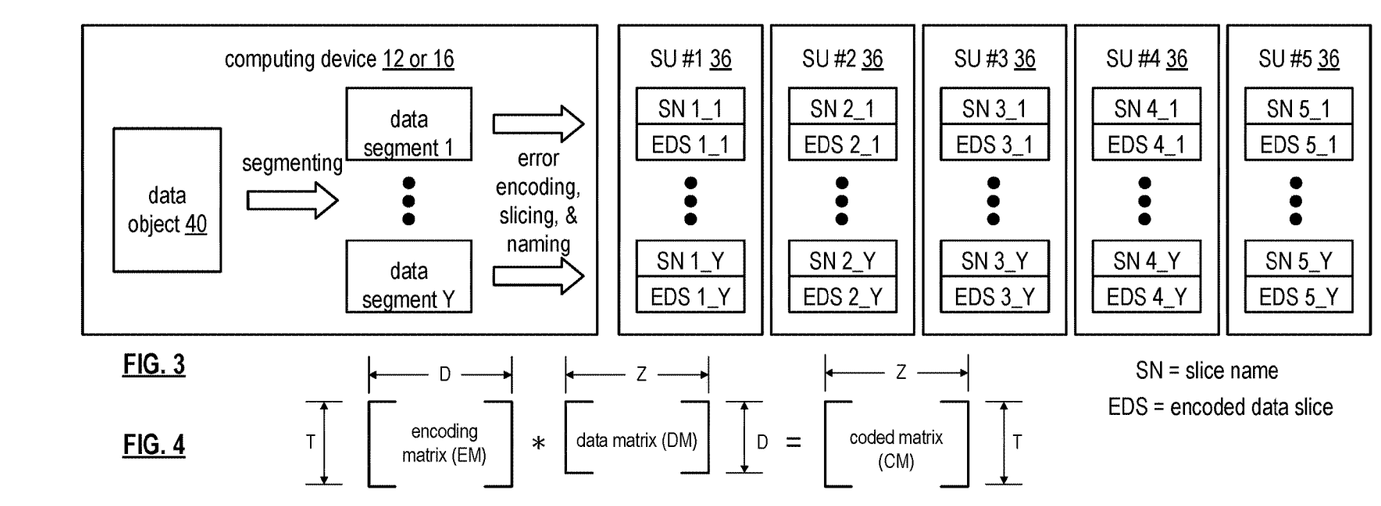
FIG. 3 is a schematic block diagram of an example of dispersed storage error encoding of data in accordance with the present invention.
FIG. 4 is a schematic block diagram of a generic example of an error encoding function in accordance with the present invention.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. Here, the computing device stores data object 40, which can include a file (e.g., text, video, audio, etc.), or other data arrangement. The dispersed storage error encoding parameters include an encoding function (e.g., information dispersal algorithm (IDA), Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

Figure 5:
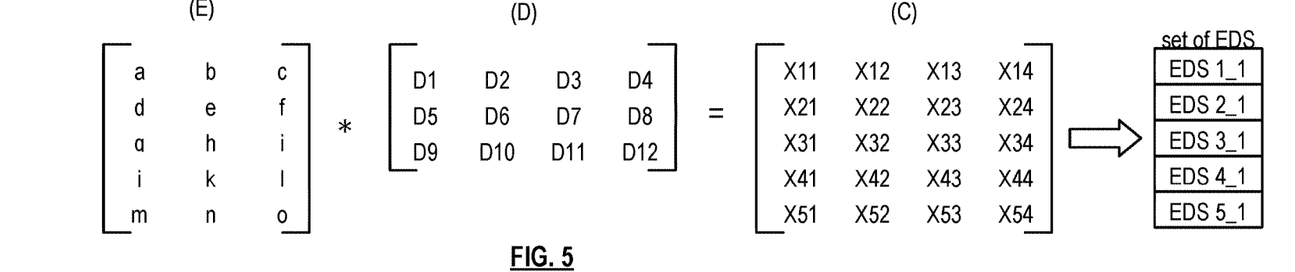
FIG. 5 is a schematic block diagram of a specific example of an error encoding function in accordance with the present invention.

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides data object 40 into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Figure 6:
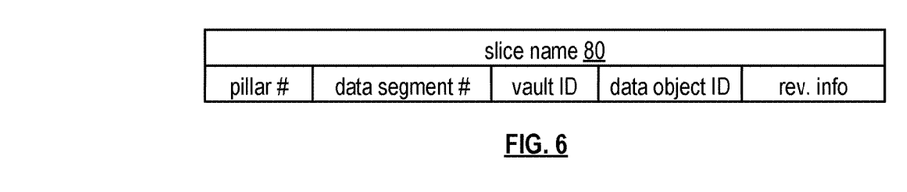
FIG. 6 is a schematic block diagram of an example of a slice name of an encoded data slice (EDS) in accordance with the present invention.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
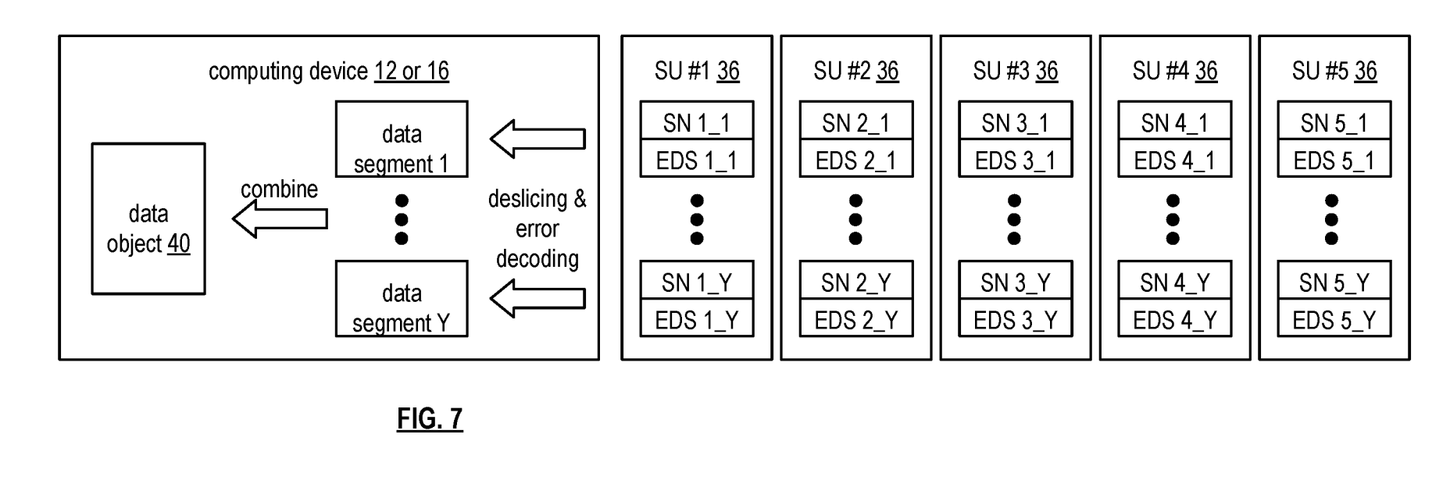
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
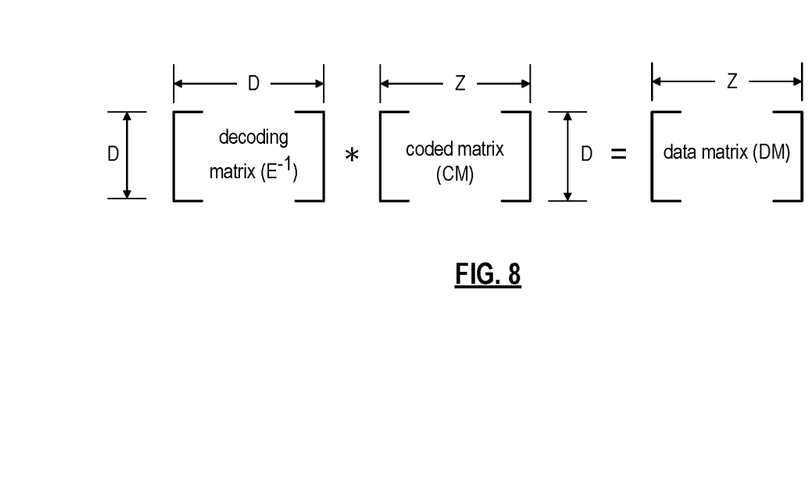
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
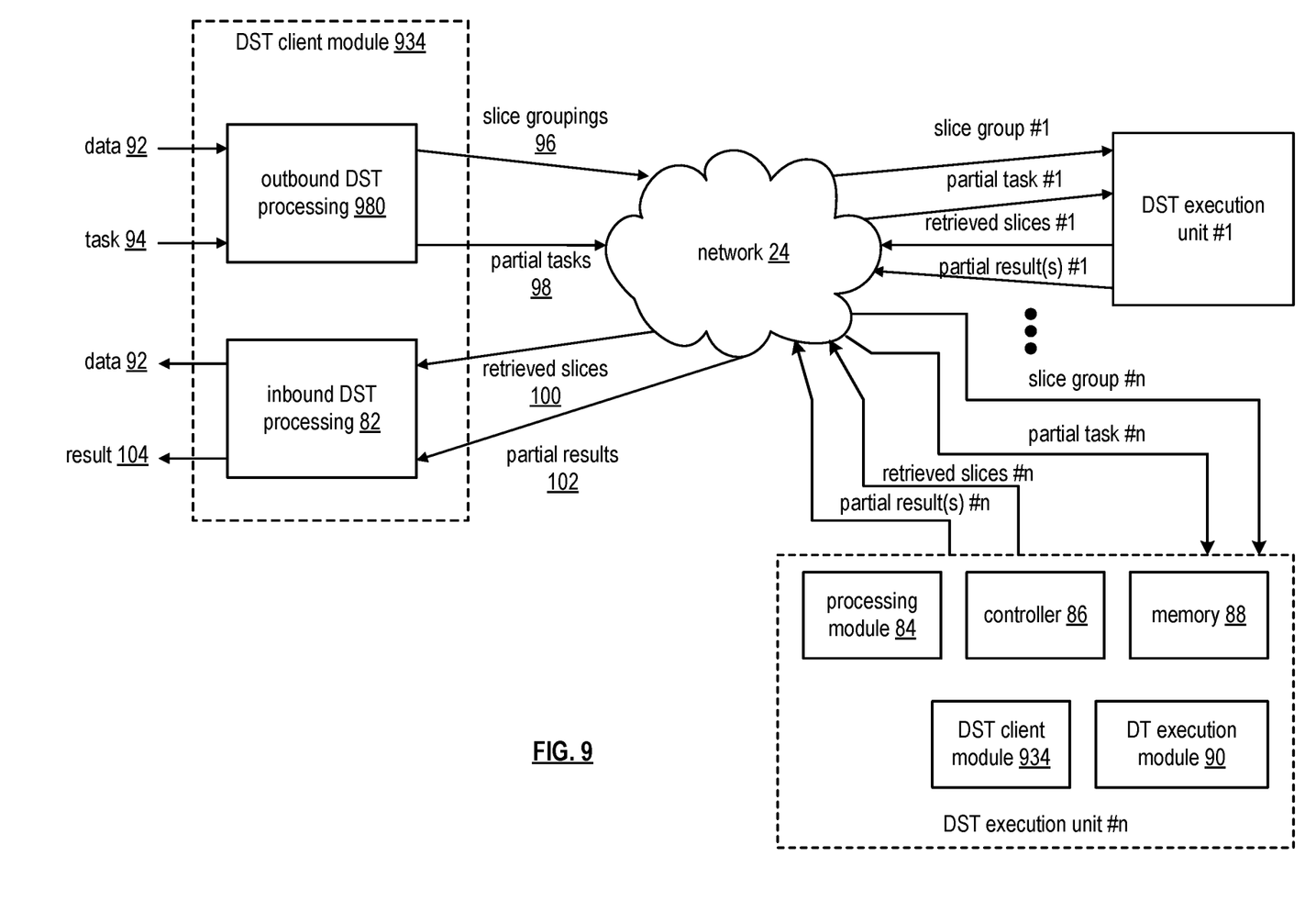
FIG. 9 is a diagram of an example of a distributed storage and task processing in accordance with various embodiments of the present invention.

FIG. 9 is a diagram of an example of the distributed computing system performing a distributed storage and task processing operation in accordance with various embodiments. The distributed computing system includes a DST (distributed storage and/or task) client module 934 (which may be in user device 14 and/or in computing device 16 of FIG. 1), a network 24, a plurality of DST execution units 1-$n$ that includes two or more execution units, which can be implemented by utilizing the storage units 36 of FIG. 1 and which form at least a portion of a DST module, such as DST memory 22 of FIG. 1, a DST managing module (not shown), and/or a DST integrity verification module (not shown). The DST client module 934 can be implemented by utilizing the DS client module 34 of FIG. 1. The DST client module 934 includes an outbound DST processing section 980 and an inbound DST processing section 82. Each of the DST execution units 1-$n$ includes a controller 86, a processing module 84, memory 88, a DT (distributed task) execution module 90, and a DST client module 934.

In an example of operation, the DST client module 934 receives data 92 and one or more tasks 94 to be performed upon the data 92. The data 92 may be of any size and of any content, where, due to the size (e.g., greater than a few Terabytes), the content (e.g., secure data, etc.), and/or task(s) (e.g., MIPS intensive), distributed processing of the task(s) on the data is desired. For example, the data 92 may be one or more digital books, a copy of a company's emails, a large-scale Internet search, a video security file, one or more entertainment video files (e.g., television programs, movies, etc.), data files, and/or any other large amount of data (e.g., greater than a few Terabytes).

Within the DST client module 934, the outbound DST processing section 980 receives the data 92 and the task(s) 94. The outbound DST processing section 980 processes the data 92 to produce slice groupings 96. As an example of such processing, the outbound DST processing section 980 partitions the data 92 into a plurality of data partitions. For each data partition, the outbound DST processing section 980 dispersed storage (DS) error encodes the data partition to produce encoded data slices and groups the encoded data slices into a slice grouping 96. In addition, the outbound DST processing section 980 partitions the task 94 into partial tasks 98, where the number of partial tasks 98 may correspond to the number of slice groupings 96.

The outbound DST processing section 980 then sends, via the network 24, the slice groupings 96 and the partial tasks 98 to the DST execution units 1-$n$ of the DST module. For example, the outbound DST processing section 980 sends slice group 1 and partial task 1 to DST execution unit 1. As another example, the outbound DST processing section 980 sends slice group #n and partial task #n to DST execution unit #n.

Each DST execution unit performs its partial task 98 upon its slice group 96 to produce partial results 102. For example, DST execution unit #1 performs partial task #1 on slice group #1 to produce a partial result #1, for results. As a more specific example, slice group #1 corresponds to a data partition of a series of digital books and the partial task #1 corresponds to searching for specific phrases, recording where the phrase is found, and establishing a phrase count. In this more specific example, the partial result #1 includes information as to where the phrase was found and includes the phrase count.

Upon completion of generating their respective partial results 102, the DST execution units send, via the network 24, their partial results 102 to the inbound DST processing section 82 of the DST client module 934. The inbound DST processing section 82 processes the received partial results 102 to produce a result 104. Continuing with the specific example of the preceding paragraph, the inbound DST processing section 82 combines the phrase count from each of the DST execution units to produce a total phrase count. In addition, the inbound DST processing section 82 combines the 'where the phrase was found' information from each of the DST execution units within their respective data partitions to produce 'where the phrase was found' information for the series of digital books.

In another example of operation, the DST client module 934 requests retrieval of stored data within the memory of the DST execution units (e.g., memory of the DSTN module). In this example, the task 94 is retrieve data stored in the memory of the DSTN module. Accordingly, the outbound DST processing section 980 converts the task 94 into a plurality of partial tasks 98 and sends the partial tasks 98 to the respective DST execution units 1-$n$.

In response to the partial task 98 of retrieving stored data, a DST execution unit identifies the corresponding encoded data slices 100 and retrieves them. For example, DST execution unit #1 receives partial task #1 and retrieves, in response thereto, retrieved slices #1. The DST execution units send their respective retrieved slices 100 to the inbound DST processing section 82 via the network 24.

The inbound DST processing section 82 converts the retrieved slices 100 into data 92. For example, the inbound DST processing section 82 de-groups the retrieved slices 100 to produce encoded slices per data partition. The inbound DST processing section 82 then DS error decodes the encoded slices per data partition to produce data partitions. The inbound DST processing section 82 de-partitions the data partitions to recapture the data 92.

Figure 10:
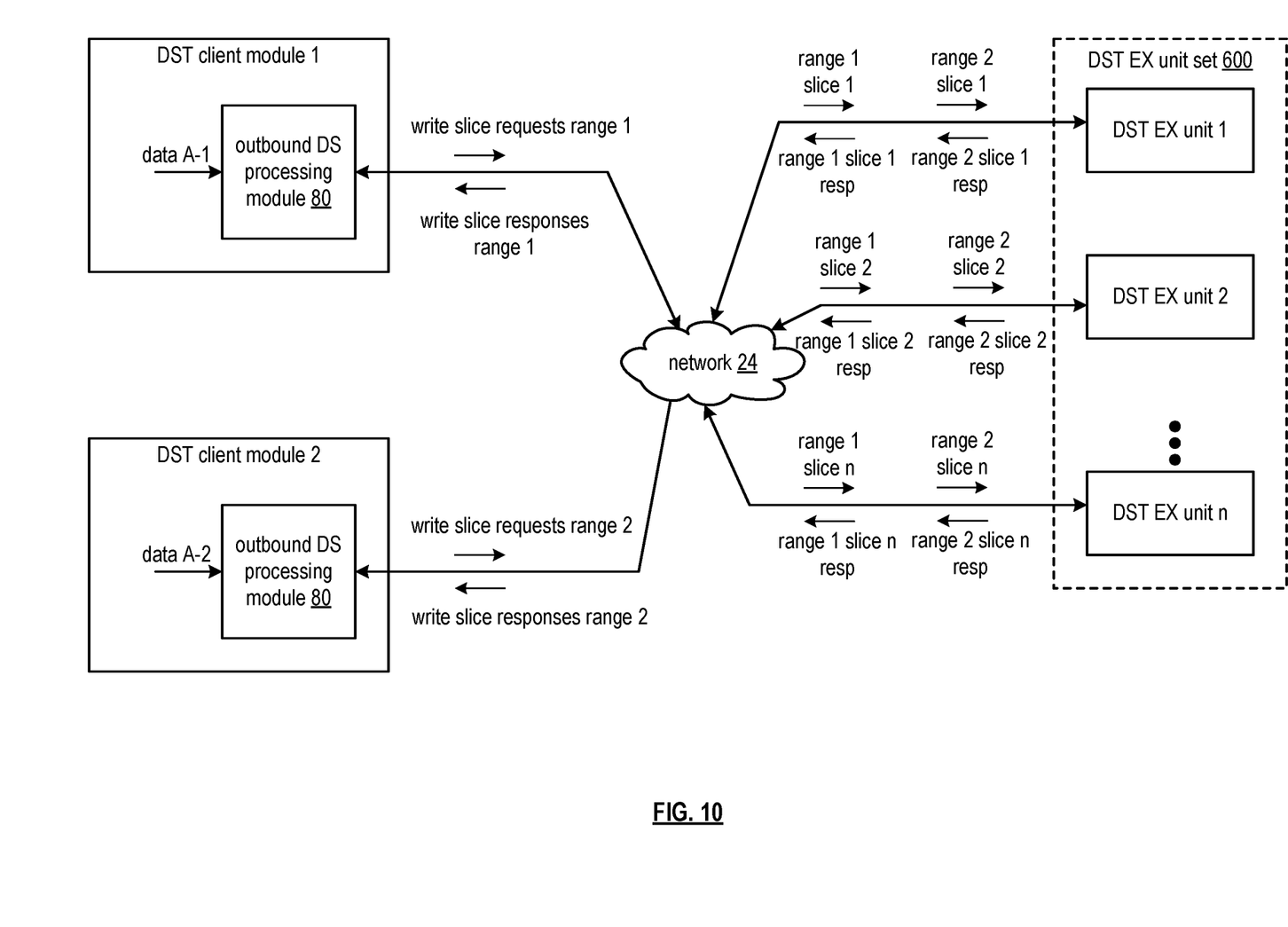
FIG. 10 is a schematic block diagram of an embodiment of a dispersed or distributed storage network (DSN) in accordance with the present invention.

FIG. 10 is a schematic block diagram of another embodiment of a dispersed storage network (DSN) that includes at least two distributed storage and task (DST) client modules 1-2, the network 24 of FIG. 1, and a DST execution unit set 600. Each DST client module may be implemented using the DST client module 934 of FIG. 9 and/or DS client module 34 of FIG. 1. For example, each DST client module can be integrated within a computing device 16 of FIG. 1. Each DST client module includes the outbound DST processing module 980 of FIG. 9. The DSN functions to resolve write conflicts while storing data in the DST execution unit set.

Writes to storage units can span a range of slices. In some cases, multiple writes span ranges of slices that do not overlap. For example, a first write request can span a set of data blocks 5-10, and a second write request can span a set of data blocks 16-19. However, there are cases where multiple writes instead span overlapping ranges. For example, a first write request can span a set of data blocks 5-10, and a second write request can span a set of data blocks 7-18, and thus both writes include data blocks 7, 8, 9, and 10. In cases where ranges of slices being written in multiple requests intersect, and thus a write conflict exists, the storage unit can order the requests sequentially, and does not allow the next to proceed before the prior requests finish. This allows for a more proper operation of the storage unit, if two intersecting ranges both wrote at the same time, the end result is not definable and could lead to corruption in some types of vaults. However when ranges are completely disjoint, and thus no write conflict exists, the storage unit allows the writes to proceed simultaneously instead of sequentially. By not requiring requests be ordered sequentially when there is no write conflict, a higher level of performance is achievable.

In an example of operation of the resolving of the write conflicts, DST client module 1 dispersed storage error encodes data A-1 to produce a plurality of sets of encoded data slices 1 (e.g., each set includes encoded data slices 1, 2, 3, through n), generates a set of write slice requests range 1 that includes the plurality of sets of encoded data slices 1, and sends, via the network 24, the set of write slice requests range 1 to the set of DST execution units 1-*n*. The range 1 can include a range of slice names associated with the plurality of sets of encoded data slices from data A-1. For example, the DST client module 1 sends, via the network 24, range 1 encoded data slices 1 to DST execution unit 1, range 1 encoded data slices 2 to DST execution unit 2, etc.

Substantially simultaneously, DST client module 2 dispersed storage error encodes data A-2 to produce a plurality of sets of encoded data slices 2 (e.g., each set includes encoded data slices 1, 2, 3, through n), generates a set of write slice requests range 2 that includes the plurality of sets of encoded data slices 2, and sends, via the network 24, the set of write slice requests range 2 to the set of DST execution units 1-*n*. The range 2 includes another range of slice names associated with the plurality of sets of encoded data slices from data A-2. For example, the DST client module 2 sends, via the network 24, range 2 encoded data slices 2 to DST execution unit 1, range 2 encoded data slices 2 to DST execution unit 2, etc.

Each DST execution unit of the DST execution unit set 600 receives a corresponding write slice request from one of the DST client module 1 and the DST client module 2, where the write slice request includes a plurality of encoded data slices for storage in the DST execution unit and a corresponding plurality of slice names of the plurality of encoded data slices. Having received the write slice request, the DST execution unit interprets the plurality of slice names to produce a slice name range (e.g., a high and low slice name produces the range). Having produced the slice name range, the DST execution unit determines whether a write lock conflict exists based on the slice name range. For example, the processing module indicates the write lock conflict when the slice name range conflicts with a previously and still active locked slice name range of the DST execution unit.

When the write lock conflict does not exist, the DST execution unit indicates that the slice name ranges are locked, initiates local storage of the received plurality of encoded data slices, issues a favorable write slice response to the corresponding one of the DST client modules 1 and 2, and indicates that the slice name range is not locked when completing the local storage of the plurality of encoded data slices (e.g., completing after receiving a corresponding commit transaction request). In this fashion, multiple write requests to non-overlapping slice name ranges can be performed simultaneously, and/or within overlapping time frames.

When the write lock conflict does exist, the DST execution unit can issue an unfavorable write slice response to the corresponding one of the DST client modules 1 and 2. The unfavorable write slice response indicates that the write lock conflict exists. Alternatively or in addition, the DST execution unit can queue the request in response to determining the write lock conflict exists. When the slice name range is no longer locked, the DST execution unit can initiate local storage of the received plurality of encoded data slices. In this fashion, multiple write requests to overlapping slice name ranges can be performed sequentially.

Figure 11:
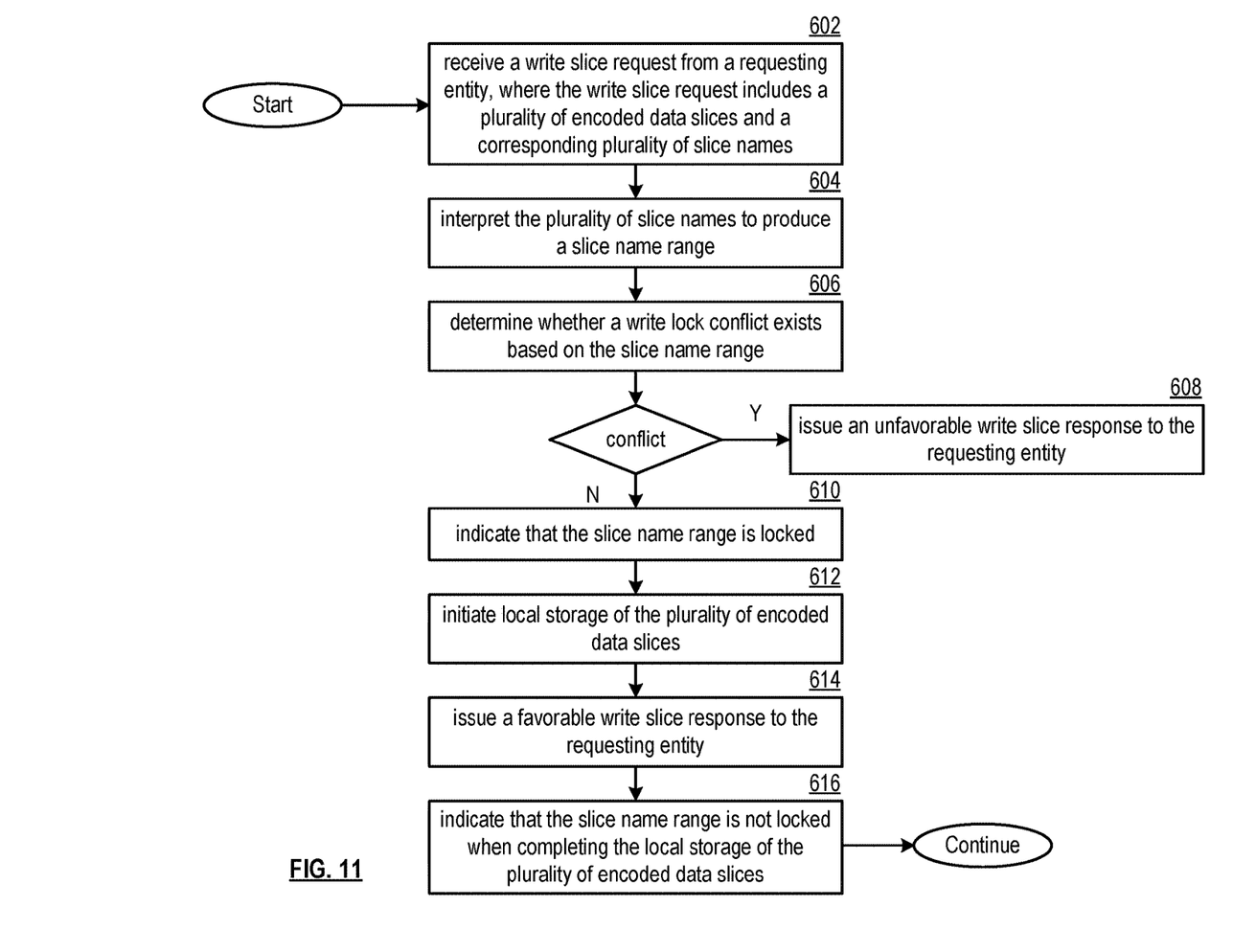
FIG. 11 is a logic diagram of an example of a method of resolving write conflicts in accordance with the present invention.

FIG. 11 is a flowchart illustrating an example of resolving write conflicts. In particular, a method is presented for use in association with one or more functions and features described in conjunction with FIGS. 1-10, for execution by a dispersed storage and task (DST) execution unit that includes a processor or via another processing system of a dispersed storage network that includes at least one processor and memory that stores instruction that configure the processor or processors to perform the steps described below.

The method begins or continues at step 602 where the processing system receives a write slice request from a requesting entity, where the write slice request includes a plurality of encoded data slices and the corresponding plurality of slice names. The method continues at step 604 where the processing system interprets the plurality of slice names to produce a slice name range. The interpreting includes identifying a lowest slice name and a high slice name of the corresponding plurality of slice names to produce the slice name range.

The method continues at step 606 where the processing system determines whether a write lock conflict exists based on the slice name range. For example, the processing system indicates that the write lock conflict exists when the slice name range conflicts with a lock slice name range. For instance, the slice name range overlaps with a retrieved locked slice name range of a currently active write lock. When the write conflict exists, the method continues at step 608 where the processing system issues an unfavorable write slice response to the requesting entity. For example, the processing system generates the unfavorable write slice response to indicate that the write lock conflict exists, and sends the write slice response to the requesting entity. When the write lock conflict does not exist, the method branches to step 610.

The method continues at step 610 where the processing system indicates that the slice name range is locked when the write conflict does not exist. For example, the processing system updates a lock slice name list to include the slice name range. The method continues at step 612 where the processing system initiates local storage of the plurality of encoded data slices. For example, the processing system stores the plurality of encoded data slices in the memory of the storage unit.

The method continues at step 614 where the processing system issues a favorable write slice response to the requesting entity. For example, the processing system generates the favorable write slice response to indicate a favorable write slice operation and sends the favorable write slice response to the requesting entity. The issuing may further include receiving at least one of a rollback transaction request and a commit transaction request followed by at least one of a finalize transaction request or an undo transaction request.

The method continues at step 616 where the processing system indicates that the slice name range is not locked when completing the local storage of the plurality of encoded data slices and/or in response to determining the local storage of the plurality of encoded data slices is complete. For example, the processing system receives the finalize transaction request and updates the locked slice name list to indicate that the slice name range is not locked.

In various embodiments, the plurality of encoded data slices are associated with at least one data segment, and the at least one data segment was dispersed storage error encoded to produce the plurality of encoded data slices for storage in a set of storage units that includes the DST execution unit. In various embodiments the method includes indicating that the slice name range is locked prior to initiating local storage of the plurality of encoded data slices. In various embodiments, producing the slice name range includes identifying a lowest slice name and a high slice name of the corresponding plurality of slice names to produce the slice name range.

In various embodiments, determining whether a write lock conflict exists includes retrieving at least one locked slice name range corresponding to at least one currently active write lock, and further includes comparing the slice name range to the at least one locked slice name range. In various embodiments, the at least one locked slice name range is retrieved from a locked slice name range list stored in local memory, and indicating that the slice name range is not locked includes updating the locked slice name range list stored in local memory. In various embodiments, a plurality of locked slice name ranges corresponding to a plurality of currently active write locks are retrieved, the plurality of currently active write locks correspond to a plurality of write slice requests received from a plurality of requesting entities, and an intersection of the plurality of locked slice name ranges is null.

In various embodiments, the write lock conflict is determined to exist in response to determining that an intersection between the slice name range and the at least one locked slice name range is non-null. In various embodiments, the intersection between the slice name range and the at least one locked slice name range is a proper subset of the slice name range and is a proper subset of the at least one locked slice name range.

In various embodiments, when the write lock conflict is determined to exist, the method includes queueing the write slice request in local memory, and determining the intersection between the slice name range and the at least one locked slice name range is null. The intersection between the slice name range and the at least one locked slice name range becomes null in response to a set of slice names included in the intersection changing from a status of locked to not locked. Local storage of the plurality of encoded data slices is initiated, a favorable write slice response is issued to the requesting entity. The method further includes indicating that the slice name range is not locked when completing the local storage of the plurality of encoded data slices.

In various embodiments, a second write slice request is received from a second requesting entity. The second write slice request is received prior to receiving the write slice request from the requesting entity, and the second write slice request includes a second plurality of encoded data slices and a second corresponding plurality of slice names. The write lock conflict is determined to not exist in response to determining an intersection between the slice name range and a second slice name range determined for the second plurality of encoded data slices is null. Local storage of the second plurality of encoded data slices is facilitated. The local storage of the second plurality of encoded data slices is initiated prior to initiation of the local storage of the plurality of encoded data slices, and the local storage of the second plurality of encoded data slices is completed after initiation of the local storage of the plurality of encoded data slices.

In various embodiments, a non-transitory computer readable storage medium includes at least one memory section that stores operational instructions that, when executed by a processing system of a dispersed storage network (DSN) that includes a processor and a memory, causes the processing system to receive a write slice request from a requesting entity, where the write slice request includes a plurality of encoded data slices and a corresponding plurality of slice names. The plurality of slice names are interpreted to produce a slice name range. Whether a write lock conflict exists is determined based on the slice name range. An unfavorable write slice response is issued to the requesting entity when the write lock conflict is determined to exist. When the write lock conflict is determined to not exist, local storage of the plurality of encoded data slices is initiated, a favorable write slice response is issued to the requesting entity, and the processing system indicates that the slice name range is not locked when completing the local storage of the plurality of encoded data slices.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provides an industry-accepted tolerance for its corresponding term and/or relativity between items. For some industries, an industry-accepted tolerance is less than one percent and, for other industries, the industry-accepted tolerance is 10 percent or more. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%).

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing system", "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing system, and/or processing unit may be, or further include, memory and/or an integrated memory element, which may be a single memory device, a plurality of memory devices, and/or embedded circuitry of another processing module, module, processing circuit, processing system, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing system, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing system, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing system, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by a storage unit that includes a processor, the method comprises:
    receiving a write slice request, wherein the write slice request includes a plurality of encoded data slices;
    generating a range corresponding to the write slice request;
    determining whether a write lock conflict exists based on the range;
    issuing an unfavorable write slice response when the write lock conflict is determined to exist;
    when the write lock conflict is determined to not exist:
        initiating local storage of the plurality of encoded data slices; and
        issuing a favorable write slice response.

2. The method of claim 1, wherein the plurality of encoded data slices are associated with at least one data segment, and wherein the at least one data segment was dispersed storage error encoded to produce the plurality of encoded data slices for storage in a set of storage units that includes the storage unit.

3. The method of claim 1, further comprising indicating that the range is locked prior to initiating local storage of the plurality of encoded data slices.

4. The method of claim 3, wherein generating the range includes identifying a lowest slice name and a high slice name of a corresponding plurality of slice names to produce the range.

5. The method of claim 4, wherein determining whether a write lock conflict exists includes retrieving at least one locked slice range corresponding to at least one currently active write lock, and further includes comparing the range to the at least one locked slice range.

6. The method of claim 5, wherein the at least one locked slice range is retrieved from a locked slice range list stored in local memory, and wherein indicating that the range is not locked includes updating the locked slice range list stored in local memory.

7. The method of claim 5, wherein a plurality of locked slice ranges corresponding to a plurality of currently active write locks are retrieved, wherein the plurality of currently active write locks correspond to a plurality of write slice requests received from a plurality of requesting entities, and wherein an intersection of the plurality of locked slice ranges is null.

8. The method of claim 5, wherein the write lock conflict is determined to exist in response to determining that an intersection between the range and the at least one locked slice range is non-null.

9. The method of claim 8, wherein the intersection between the range and the at least one locked slice range is a proper subset of the range and is a proper subset of the at least one locked slice range.

10. The method of claim 8, further comprising, when the write lock conflict is determined to exist:
    queueing the write slice request in local memory;
    determining the intersection between the range and the at least one locked slice range is null, wherein the intersection between the range and the at least one locked slice range becomes null in response to a set of slice names included in the intersection changing from a status of locked to not locked;
    initiating local storage of the plurality of encoded data slices;
    issuing a favorable write slice response; and
    indicating that the range is not locked when completing the local storage of the plurality of encoded data slices.

11. The method of claim 1, further comprising:
    receiving a second write slice request from a second requesting entity, wherein the second write slice request is received prior to receiving the write slice request from a first requesting entity, wherein the second write slice request includes a second plurality of encoded data slices and a second corresponding plurality of slice names, and wherein the write lock conflict is determined to not exist in response to determining an intersection between the range and a second slice range determined for the second plurality of encoded data slices is null; and
    facilitating local storage of the second plurality of encoded data slices, wherein the local storage of the second plurality of encoded data slices is initiated prior to initiation of the local storage of the plurality of encoded data slices, and wherein the local storage of the second plurality of encoded data slices is completed after initiation of the local storage of the plurality of encoded data slices.

12. A processing system of a storage unit comprises:
    at least one processor;
    a memory that stores operational instructions, that when executed by the at least one processor cause the processing system to perform operations that include:
        receiving a write slice request, wherein the write slice request includes a plurality of encoded data slices;
        generating a range corresponding to the write slice request;
        determining whether a write lock conflict exists based on the range;

issuing an unfavorable write slice response when the write lock conflict is determined to exist;
when the write lock conflict is determined to not exist:
initiating local storage of the plurality of encoded data slices; and
issuing a favorable write slice response.

13. The processing system of claim 12, wherein the plurality of encoded data slices are associated with at least one data segment, and wherein the at least one data segment was dispersed storage error encoded to produce the plurality of encoded data slices for storage in a set of storage units that includes the storage unit.

14. The processing system of claim 12, wherein the operational instructions, when executed by the at least one processor, further cause the processing system to indicate that the range is locked prior to initiating local storage of the plurality of encoded data slices.

15. The processing system of claim 14, wherein determining whether a write lock conflict exists includes retrieving at least one locked slice range corresponding to at least one currently active write lock, and further includes comparing the range to the at least one locked slice range.

16. The processing system of claim 15, wherein the at least one locked slice range is retrieved from a locked slice range list stored in local memory, and wherein indicating that the range is not locked includes updating the locked slice range list stored in local memory.

17. The processing system of claim 15, wherein the write lock conflict is determined to exist in response to determining that an intersection between the range and the at least one locked slice range is non-null.

18. The processing system of claim 17, wherein the operational instructions, when executed by the at least one processor, further cause the processing system to, when the write lock conflict is determined to exist:
queue the write slice request in local memory;
determine the intersection between the range and the at least one locked slice range is null, wherein the intersection between the range and the at least one locked slice range becomes null in response to a set of slice names included in the intersection changing from a status of locked to not locked;
initiate local storage of the plurality of encoded data slices;
issue a favorable write slice response; and
indicate that the range is not locked when completing the local storage of the plurality of encoded data slices.

19. The processing system of claim 12, wherein the operational instructions, when executed by the at least one processor, further cause the processing system to:
receive a second write slice request from a second requesting entity, wherein the second write slice request is received prior to receiving the write slice request from the requesting entity, wherein the second write slice request includes a second plurality of encoded data slices and a second corresponding plurality of slice names, and wherein the write lock conflict is determined to not exist in response to determining an intersection between the range and a second slice range determined for the second plurality of encoded data slices is null; and
facilitate local storage of the second plurality of encoded data slices, wherein the local storage of the second plurality of encoded data slices is initiated prior to initiation of the local storage of the plurality of encoded data slices, and wherein the local storage of the second plurality of encoded data slices is completed after initiation of the local storage of the plurality of encoded data slices.

20. A tangible computer readable storage medium comprises:
at least one memory section that stores operational instructions that, when executed by a processing system of a dispersed storage network (DSN) that includes a processor and a memory, causes the processing system to perform operations that include:
receiving a write slice request, wherein the write slice request includes a plurality of encoded data slices;
generating a range corresponding to the write slice request;
determining whether a write lock conflict exists based on the range;
issuing an unfavorable write slice response when the write lock conflict is determined to exist;
when the write lock conflict is determined to not exist:
initiating local storage of the plurality of encoded data slices; and
issuing a favorable write slice response.

* * * * *